(12) United States Patent
Nakagawa et al.

(10) Patent No.: US 6,690,085 B2
(45) Date of Patent: Feb. 10, 2004

(54) HIGH-VOLTAGE SEMICONDUCTOR DEVICE USED AS SWITCHING ELEMENT OR THE LIKE

(75) Inventors: Akio Nakagawa, Fujisawa (JP); Yusuke Kawaguchi, Miura-gun (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/195,360

(22) Filed: Jul. 16, 2002

(65) Prior Publication Data

US 2003/0015771 A1 Jan. 23, 2003

(30) Foreign Application Priority Data

Jul. 17, 2001  (JP) ........................................ 2001-216987

(51) Int. Cl.[7] .............................................. H01L 31/117
(52) U.S. Cl. ...................... 257/656; 257/656; 257/332
(58) Field of Search ................................. 257/656, 330, 257/333, 155, 475, 296, 655, 328

(56) References Cited

U.S. PATENT DOCUMENTS

| | | | | |
|---|---|---|---|---|
| 5,216,275 A | * | 6/1993 | Chen | 257/493 |
| 5,241,195 A | * | 8/1993 | Tu et al. | 257/155 |
| 5,278,443 A | * | 1/1994 | Mori et al. | 257/475 |
| 6,040,600 A | * | 3/2000 | Uenishi et al. | 257/330 |
| 6,201,279 B1 | * | 3/2001 | Pfirsch | 257/333 |
| 6,303,954 B1 | * | 10/2001 | Ohoka | 257/296 |
| 6,501,146 B1 | * | 12/2002 | Harada | 257/475 |

OTHER PUBLICATIONS

U.S. patent application Publication by Tihanyl US class 257/328 May 30, 2002.*

* cited by examiner

*Primary Examiner*—David Nelms
*Assistant Examiner*—Thinh T. Nguyen
(74) *Attorney, Agent, or Firm*—Oblon, Spivak, McClelland, Maier & Neustadt, P.C.

(57) ABSTRACT

A semiconductor device has a first-conductivity-type semiconductor region, second-conductivity-type semiconductor region, and a high-resistance region. The first-conductivity-type semiconductor region is formed on a first-conductivity-type semiconductor body and has an electric resistance higher than that of the first-conductivity-type semiconductor body. The second-conductivity-type semiconductor region is formed on the first-conductivity-type semiconductor region. The high-resistance region is in contact with the first-conductivity-type and second-conductivity-type semiconductor regions and extends from the upper surface of the second-conductivity-type semiconductor region in the direction of the first-conductivity-type semiconductor body.

22 Claims, 5 Drawing Sheets

HIGH-VOLTAGE SEMICONDUCTOR DEVICE USED AS SWITCHING ELEMENT OR THE LIKE

CROSS-REFERENCE TO RELATED APPLICATIONS

This application is based upon and claims the benefit of priority from the prior Japanese Patent Application No. 2001-216987, filed Jul. 17, 2001, the entire contents of which are incorporated herein by reference.

BACKGROUND OF THE INVENTION

1. Field of the Invention

The present invention relates to a semiconductor device and, more particularly, to a high-voltage semiconductor device used as a switching element for a power device or the like.

2. Description of the Related Art

The structure and characteristics of a high-voltage diode and high-voltage transistor serving as conventional high-voltage semiconductor devices will be described below.

FIG. 1 is a sectional view showing the structure of a conventional high-voltage diode.

As shown in FIG. 1, a high-resistance n$^-$-type epitaxial layer 102 is formed on one surface of a low-resistance n$^+$-type semiconductor substrate 101. A low-resistance p$^+$-type anode layer 103 is formed on the n$^-$-type epitaxial layer 102. An anode electrode 104 is formed on the p$^+$-type anode layer 103. An anode terminal A is connected to the anode electrode 104.

A cathode electrode 105 is formed on the other surface of the n$^+$-type semiconductor substrate 101. A cathode terminal K is connected to the cathode electrode 105.

In the high-voltage diode having the structure shown in FIG. 1, a depletion layer spreads from the p$^+$-type anode layer 103 to the inside of the n$^-$-type epitaxial layer 102. This relaxes an electric field in this region, thereby implementing a high breakdown voltage.

When a reverse bias is applied, as shown in FIG. 2, such a high-voltage diode exhibits an electric field distribution in which an electric field is uniformly reduced from the anode side to the cathode side. To realize a necessary breakdown voltage, the thickness of the n$^-$-type epitaxial layer 102 must be increased. However, when the thickness of the n$^-$-type epitaxial layer 102 is increased, an ON resistance increases. An increase in ON resistance similarly occurs when this structure is applied to a MOS field effect transistor (to be referred to as a MOSFET hereinafter).

To solve this, a high-voltage diode shown in FIG. 3 which can obtain a high breakdown voltage without increasing an ON resistance is proposed. This high-voltage diode has the following structure.

As shown in FIG. 3, trenches which extend from the upper surface of the p$^+$-type anode layer 103 to the n$^+$-type semiconductor substrate 101 are formed in the p$^+$-type anode layer 103 and n$^-$-type epitaxial layer 102. An oxide film 106 is formed on the inner wall of each trench. A semi-insulating high-resistance element 107 is buried in each trench in which the oxide film 106 is formed.

The high-voltage diode shown in FIG. 3 has the oxide film 106 between the n$^-$-type epitaxial layer 102 and high-resistance element 107. A large-capacitance capacitor is thus formed between the n$^-$-type epitaxial layer 102 and high-resistance element 107. Letting R be the resistance of the high-resistance element 107, and C be the capacitance of the capacitor, a CR time constant at the start of operation increases, and depletion layer formation takes a long time, thereby making a leakage current keep flowing until the depletion layer formation ends. This means that a long time is required for obtaining dielectric breakdown. Consequently, when a high voltage is abruptly applied between the anode terminal A and cathode terminal K at the start of operation, sometimes the leakage current increases to damage the high-voltage diode.

In addition, after forming the trenches in the n$^-$-type epitaxial layer 102, the high-voltage diode shown in FIG. 3 requires the step of oxidizing the inner walls of the trenches and then removing the oxide films on the bottom surfaces of the trenches. This results in the manufacturing disadvantage of the high-voltage diode.

BRIEF SUMMARY OF THE INVENTION

A semiconductor device according to an aspect of the present invention comprises: a first-conductivity-type semiconductor region formed on a first-conductivity-type semiconductor body, the first-conductivity-type semiconductor region having an electric resistance higher than that of the first-conductivity-type semiconductor body; a second-conductivity-type semiconductor region formed on the first-conductivity-type semiconductor region; and a high-resistance region formed in the first-conductivity-type and second-conductivity-type semiconductor regions, the high-resistance region being in contact with the first-conductivity-type and second-conductivity-type semiconductor regions and extending from an upper surface of the second-conductivity-type semiconductor region in a direction of the first-conductivity-type semiconductor body.

DETAILED DESCRIPTION OF THE INVENTION

Figure 1:
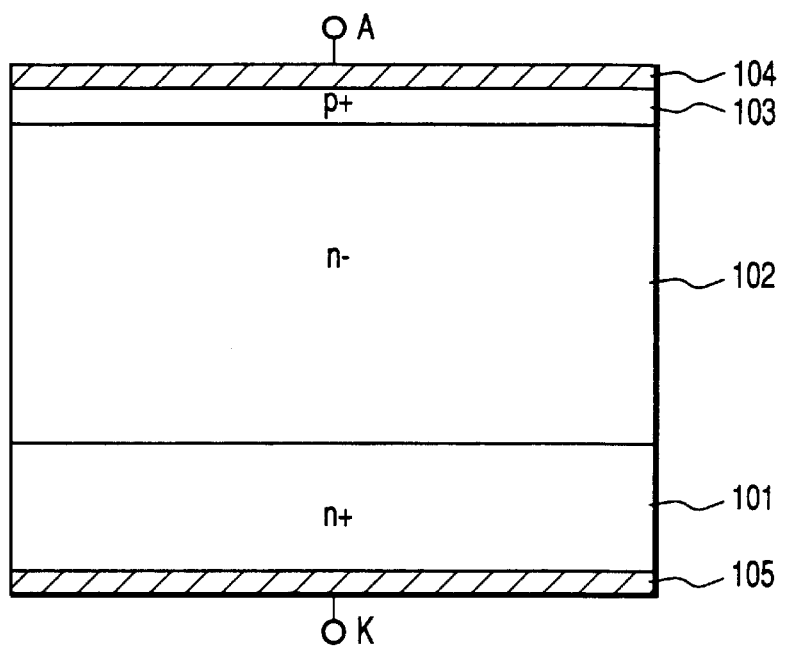
FIG. 1 is a sectional view showing the structure of a conventional high-voltage diode.
Figure 2:
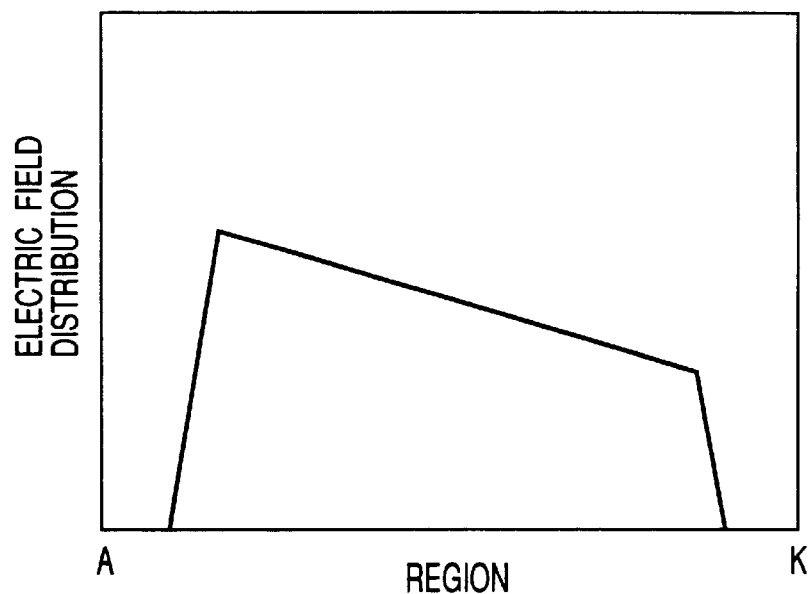
FIG. 2 is a graph showing the electric field distribution of the conventional high-voltage diode.

Embodiments of the present invention will be described below with reference to the accompanying drawing. In the following explanation, the same reference numerals denote the same parts throughout the views.

First Embodiment

A semiconductor device according to a first embodiment of the present invention will be described first.

Figure 4:
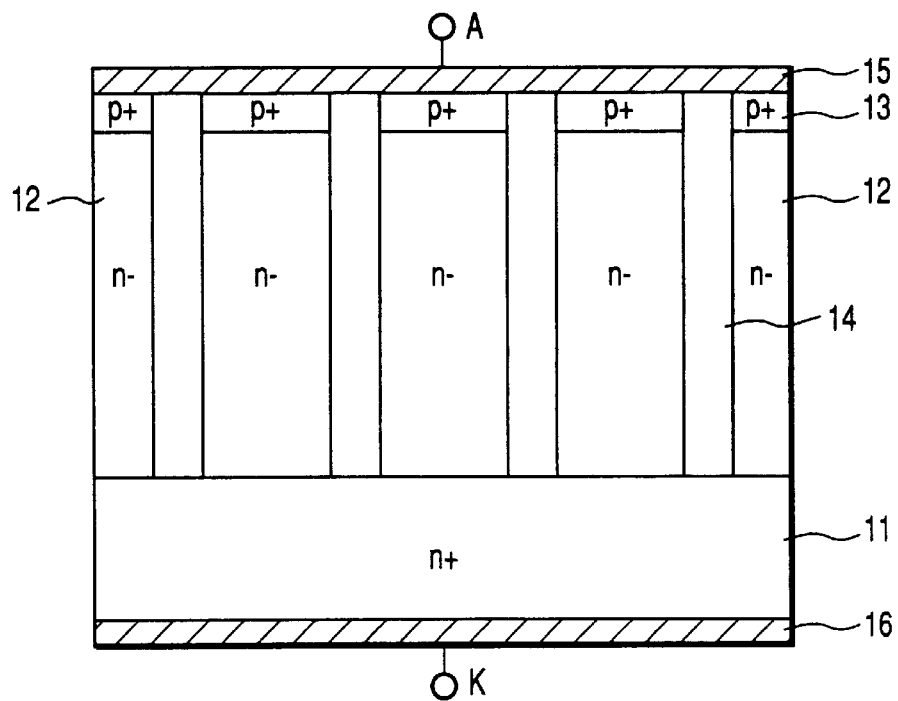
FIG. 4 is a sectional view showing the structure of a high-voltage diode according to a first embodiment of the present invention.
Figure 5:
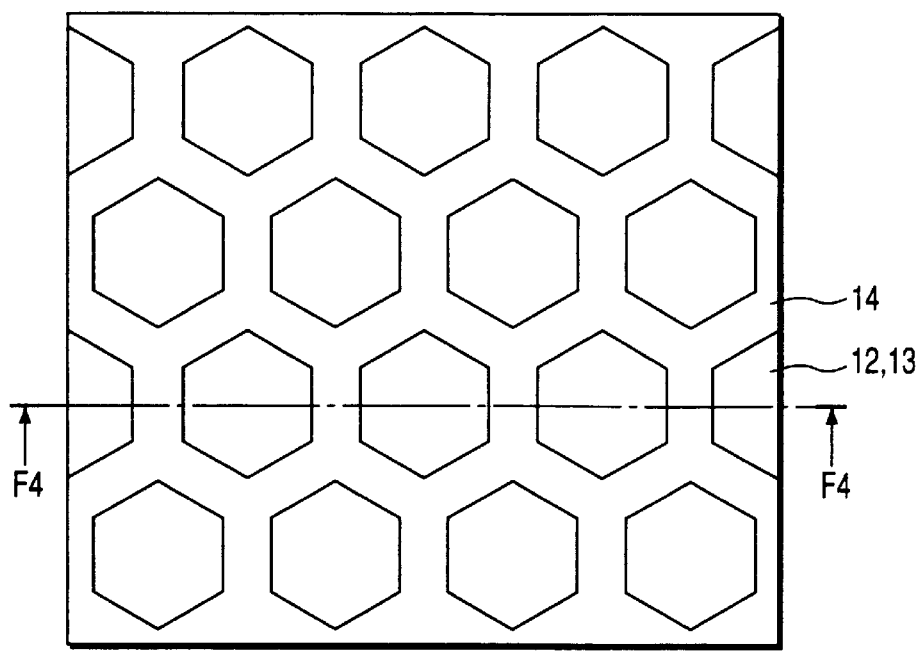
FIG. 5 is a plan view of the high-voltage diode according to the first embodiment.

FIG. 4 is a sectional view showing the structure of a high-voltage diode according to the first embodiment, and FIG. 5 is a plan view of the high-voltage diode.

As shown in FIG. 4, a high-resistance n$^-$-type epitaxial layer 12 is formed on a low-resistance n$^+$-type semiconductor substrate 11. A low-resistance p$^+$-type anode layer 13 is formed on the n$^-$-type epitaxial layer 12. The n$^-$-type epitaxial layer 12 has the total amount of an impurity (dose) per area of about $2.0 \times 10^{12}$ cm$^{-2}$.

Trenches which extend from the upper surface of the p$^+$-type anode layer 13 to the n$^+$-type semiconductor substrate 11 are formed in the p$^+$-type anode layer 13 and n$^-$-type epitaxial layer 12. The trenches are filled with semi-insulating high-resistance elements, e.g., SIPOS (Semi-Insulated polysilicon) layers 14.

In the sectional structure in FIG. 4, the SIPOS layers 14 are arranged in stripe to be spaced at a predetermined gap in the p$^+$-type anode layer 13 and n$^-$-type epitaxial layer 12. The SIPOS layers 14 have a width of about 0.5 to 2 μm each, and the n$^-$-type epitaxial layer 12 between the SIPOS layers 14 has a width of about 2 to 15 μm. The SIPOS layers 14 are formed by doping oxygen in silicon and have a resistivity of about $1.0 \times 10^8$ to $1.0 \times 10^{13}$ Ω·cm. Note that the SIPOS layer is used in this embodiment, but other high-resistance elements having the aforementioned resistivity, e.g., a high-resistance element such as silicon nitride having excessive silicon and the like may be used.

An anode electrode 15 is formed on the p$^+$-type anode layer 13. An anode terminal A is connected to the anode electrode 15. A cathode electrode 16 is formed on the lower surface of the n$^+$-type semiconductor substrate 11. A cathode terminal K is connected to the cathode electrode 16.

FIG. 5 is a plan view of the high-voltage diode described above. FIG. 5 shows the layout of silicon layers and the SIPOS layers 14 through the anode electrode 15. The silicon layers are formed from the p$^+$-type anode layer 13 and the n$^-$-type epitaxial layer 12 serving as the underlying layer of the p$^+$-type anode layer 13. FIG. 4 shows the sectional view taken along the line F4—F4 in FIG. 5.

As shown in FIG. 5, the silicon layers (p$^+$-type anode layer 13 and n$^-$-type epitaxial layer 12) are arranged to be spaced at a predetermined gap, and the SIPOS layers 14 are formed between the silicon layers.

Figure 6:
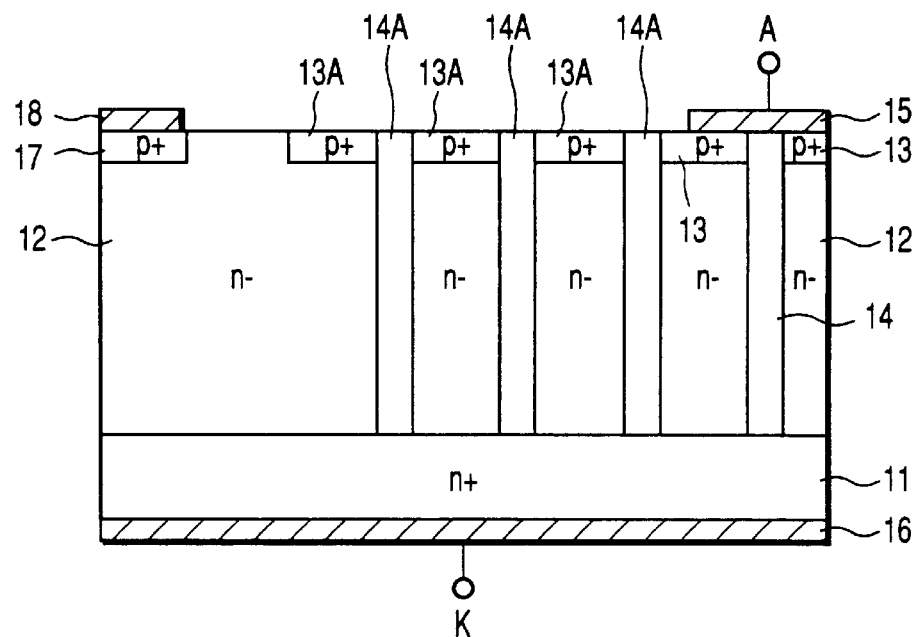
FIG. 6 is a sectional view showing the structure of the terminal end portion of the high-voltage diode according to the first embodiment.

The structure of the terminal end portion of the high-voltage diode shown in FIG. 4 will be described. FIG. 6 is a sectional view showing the structure of the terminal end portion of the high-voltage diode.

As shown in FIG. 6, outside the SIPOS layers 14 which are electrically connected to the anode electrode 15, a plurality of SIPOS layers 14A are arranged from the center to the terminal end portion to be spaced at a predetermined gap. The anode electrode 15 is not formed on the SIPOS layers 14A. P$^+$-type layers 13A are formed between the SIPOS layers 14A and on the terminal end portion side of one of the outermost SIPOS layers 14A. These p$^+$-type layers 13A are electrically connected to neither the anode electrode 15 nor cathode electrode 16, resulting in an electrically floating state. An electrode 18 and an n$^+$-type layer 17 are formed on the terminal end portion of the n$^-$-type epitaxial layer 12.

Since the potential of the n$^-$-type epitaxial layer 12 is generally clamped from the one side at the terminal end portion of the high-voltage diode, a breakdown voltage decreases in the vicinity of the terminal end portion.

To solve this, as shown in FIG. 6, the p$^+$type layers 13A which are electrically connected to neither the anode electrode 15 nor cathode electrode 16 are formed in the vicinity of the terminal end portion of the diode shown in FIG. 4. With this structure, the closer to the terminal end portion, the higher the potential of the p$^+$-type layer 13A, thereby forming the structure suitable for a high breakdown voltage.

Figure 7:
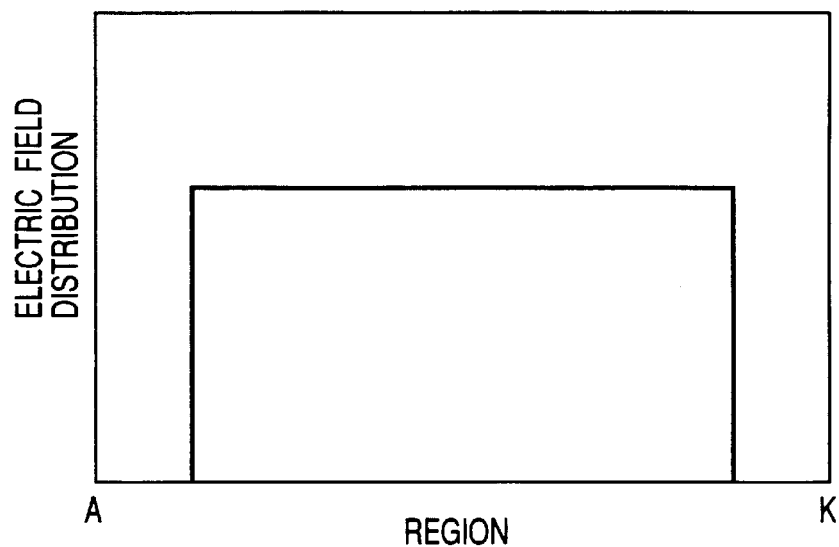
FIG. 7 is a graph showing the electric field distribution of the high-voltage diode according to the first embodiment.

When a reverse bias is applied between the anode terminal A and cathode terminal K in the high-voltage diode having the structure shown in FIG. 4, a small current flows in the SIPOS layers 14 from the cathode terminal K to the anode terminal A. The potential of the n$^-$-type epitaxial layer 12 is clamped by the SIPOS layers 14 to make the electric field distribution of the n$^-$-type epitaxial layer 12 uniform as shown in FIG. 7. Therefore, as compared with the conventional diode shown in FIG. 1, the high-voltage diode in the first embodiment can realize a high breakdown voltage by using the n$^-$-type epitaxial layer 12 having a small length (small thickness).

Figure 3:
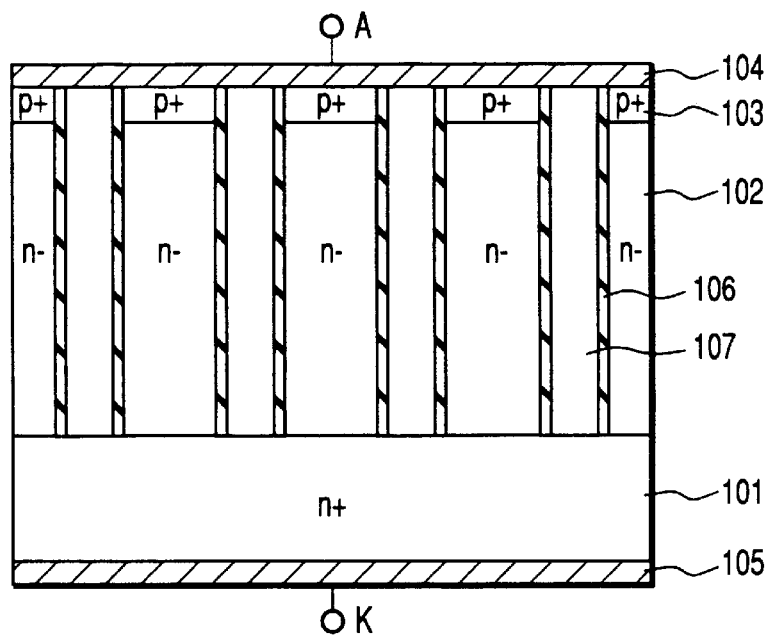
FIG. 3 is a sectional view showing the structure of another conventional high-voltage diode.

In addition, the high-voltage diode has no oxide film between the n$^-$-type epitaxial layer 12 and semi-insulating high-resistance element 14, and is formed such that the high-resistance element 14 is in contact with the n$^-$-type epitaxial layer 12 serving as the inner wall of the trench. This prevents forming a large-capacitance capacitor between the n$^-$-type epitaxial layer 12 and SIPOS layer 14. As compared with the conventional diode shown in FIG. 3, a CR time constant at the start of operation does not increase, and depletion layer formation does not take a long time. Therefore, a depletion layer can be immediately formed, and a leakage current can be decreased. With this structure, even when a high voltage is abruptly applied at the start of operation, the leakage current can be decreased, and damage to the high-voltage diode can be prevented.

Further, the high-voltage diode shown in FIG. 4 does not require the step of oxidizing the inner walls of the trenches formed in the n$^-$-type epitaxial layer 12, and removing the oxide films on the bottom surfaces of the trenches. This can advantageously manufacture the diode.

Note that, as shown in FIG. 5, the first embodiment exemplifies a case wherein the silicon layers (p$^+$-type anode layer 13 and n$^-$-type epitaxial layer 12) are arranged to be spaced at a predetermined gap, and the SIPOS layers 14 are formed between the silicon layers. However, the SIPOS layers 14 may be arranged to be spaced at a predetermined gap, and the silicon layers (p$^+$-type anode layer 13 and n$^-$-type epitaxial layer 12) may be formed between the SIPOS layers 14. That is, the silicon layers 12 and 13 and the SIPOS layers 14 in FIG. 5 may be replaced with each other. In this case, the SIPOS layers 14A which are electrically connected to nothing are formed in the vicinity of the terminal end portion of the diode shown in FIG. 4. Therefore, the structure suitable for a high breakdown voltage can be formed.

As described above, the high-voltage diode in the first embodiment can obtain a high breakdown voltage and stably operate at the start of operation.

Second Embodiment

A semiconductor device according to a second embodiment will be described, in which the present invention is applied to a MOS field effect transistor (MOSFET).

Figure 8:
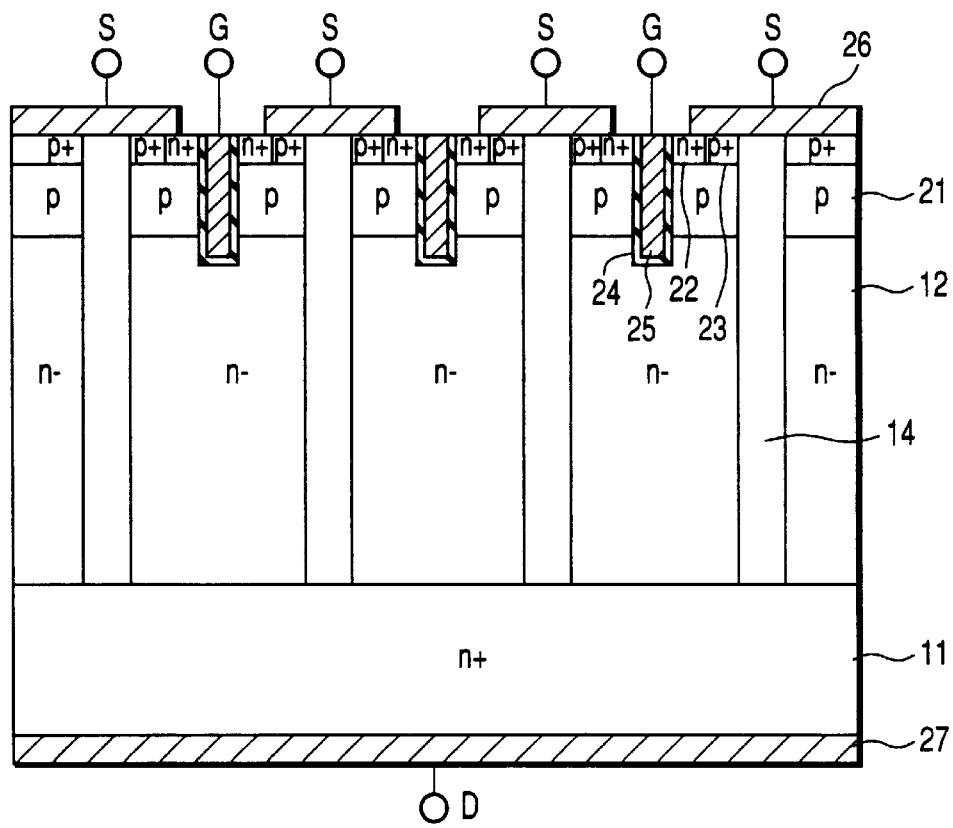
FIG. 8 is a sectional view showing the structure of a high-voltage MOS field effect transistor according to a second embodiment of the present invention.

FIG. 8 is a sectional view showing the structure of a high-voltage MOS field effect transistor in the second embodiment. The MOSFET is a trench gate transistor in which a gate electrode is buried in a trench.

As shown in FIG. 8, a high-resistance n⁻-type epitaxial layer 12 is formed on a low-resistance n⁺-type semiconductor substrate 11. A p-type base layer 21 is formed on the n⁻-type epitaxial layer 12. Low-resistance n⁺-type source layers 22 and p⁺-type contact layers 23 are formed on the p-type base layer 21. The n⁻-type epitaxial layer 12 has the total amount of an impurity (dose) per area of about $2.0 \times 10^{12}$ cm$^{-2}$.

Trenches which extend from the upper surfaces of the p⁺-type contact layers 23 to the n⁺-type semiconductor substrate 11 are formed in the p⁺-type contact layers 23, p-type base layer 21, and n⁻-type epitaxial layer 12. The trenches are filled with SIPOS layers 14. In this case, the SIPOS layers 14 are formed so as to contact the n⁻-type epitaxial layer 12 serving as the inner walls of the trenches.

The SIPOS layers 14 are similar to those in the first embodiment, which are arranged to be spaced at a predetermined gap in the p⁺-type contact layers 23, p-type base layer 21, and n⁻-type epitaxial layer 12.

Trenches which extend from the upper surfaces of the n⁺-type source layers 22 to the n⁻-type epitaxial layer 12 are formed in regions between the SIPOS layers 14. A gate insulating film 24 is formed on the inner wall of each trench. A gate electrode 25 is formed on the gate insulating film 24 in each trench. The gate electrode 25 is buried from the upper surface of the n⁺-type source layers 22 to the n⁻-type epitaxial layer 12 through the p-type base layer 21. More specifically, the gate electrode 25 is buried to have a level lower than the upper surface of the p-type base layer 21 and higher than the lower surface of the SIPOS layer 14.

Source electrodes 26 are formed on the p⁺-type contact layers 23, n⁺-type source layers 22, and SIPOS layers 14. Source terminals S are connected to the source electrodes 26. A drain electrode 27 is formed on the lower surface of the n⁺-type semiconductor substrate 11. A drain terminal D is connected to the drain electrode 27.

In the high-voltage MOSFET having the structure described above, trenches formed in the n⁻-type epitaxial layer 12 are filled with the SIPOS layers serving as semi-insulating high-resistance elements. With this structure, a small current flows in the SIPOS layer 14 from the source terminal S to the drain terminal D. The potential of the n⁻-type epitaxial layer 12 is thus clamped by the SIPOS layers 14 to make the electric field distribution of the n⁻-type epitaxial layer 12 uniform as shown in FIG. 7. In addition, the gate electrode 25 is buried in each trench between the SIPOS layers 14. By forming the MOSFET having the structure described above, a high breakdown voltage can be obtained by the n⁻-type epitaxial layer 12 with a small length (small thickness). As a result, a high-resistance MOSFET can be implemented with a low ON resistance.

As described above, in the second embodiment, the MOS field effect transistor having the structure in which a gate electrode is buried in a trench can obtain a high breakdown voltage without increasing an ON resistance.

Third Embodiment

A semiconductor device according to a third embodiment of the present invention will be described. In the second embodiment, the trench gate MOSFET has been described, and a planar MOSFET will be described in the third embodiment.

Figure 9:
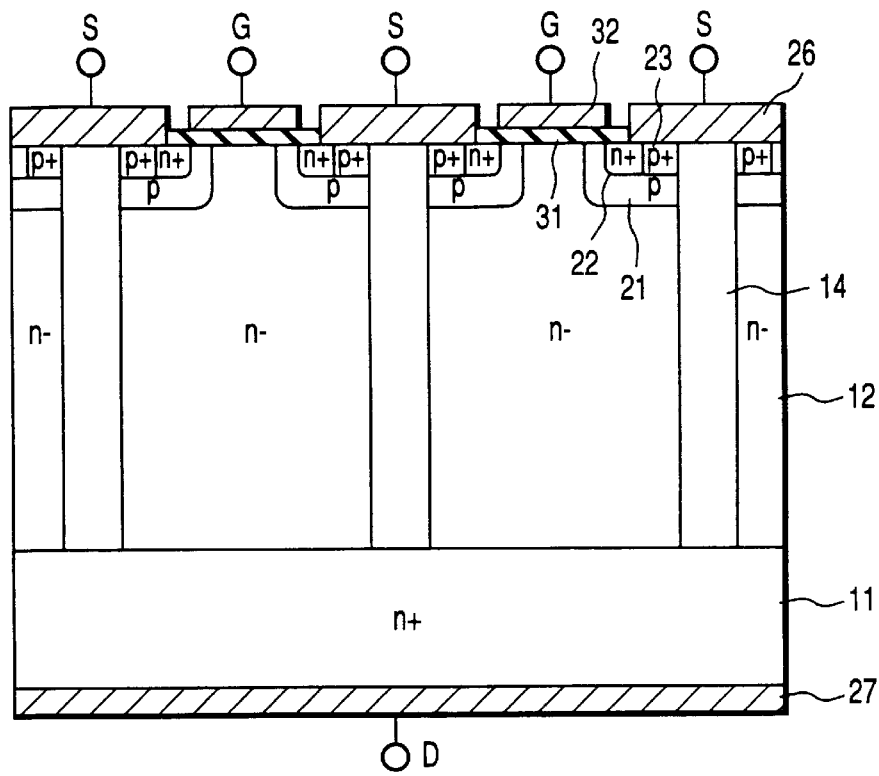
FIG. 9 is a sectional view showing the structure of a high-voltage MOS field effect transistor according to a third embodiment of the present invention.

FIG. 9 is a sectional view showing the structure of a planar MOS field effect transistor in the third embodiment.

As shown in FIG. 9, a high-resistance n⁻-type epitaxial layer 12 is formed on a low-resistance n⁺-type semiconductor substrate 11. P-type base layers 21 are formed on the n⁻-type epitaxial layer 12. Low-resistance n⁺-type source layers 22 and p⁺-type contact layers 23 are formed on the p-type base layers 21. The n⁻-type epitaxial layer 12 has the total amount of an impurity (dose) per area of about $2.0 \times 10^{12}$ cm$^{-2}$.

Trenches which extend from the upper surfaces of the p⁺-type contact layers 23 to the n⁺-type semiconductor substrate 11 are formed in the p⁺-type contact layers 23, p-type base layers 21, and n⁻-type epitaxial layer 12. The trenches are filled with SIPOS layers 14. In this case, the SIPOS layers 14 are formed so as to contact the n⁻-type epitaxial layer 12 serving as the inner walls of the trenches.

The SIPOS layers 14 are similar to those in the first and second embodiments, which are arranged to be spaced at a predetermined gap in the p⁺-type contact layers 23, p-type base layers 21, and n⁻-type epitaxial layer 12.

Gate insulating films 31 are formed on the p-type base layers 21 between the SIPOS layers 14. Gate electrodes 32 are formed on the p-type base layers 31.

Source electrodes 26 are formed on the p⁺-type contact layers 23, n⁺-type source layers 22, and SIPOS layers 14. Source terminals S are connected to the source electrodes 26. A drain electrode 27 is formed on the lower surface of the n⁺-type semiconductor substrate 11. A drain terminal D is connected to the drain electrode 27.

Similar to the trench gate MOSFET, in the planar MOSFET having the structure described above, trenches formed in the n⁻-type epitaxial layer 12 are filled with the SIPOS layers 14. With this structure, a small current flows in the SIPOS layer 14 from the source terminal S to the drain terminal D. The potential of the n⁻-type epitaxial layer 12 is thus clamped by the SIPOS layers 14 to make the electric field distribution of the n⁻-type epitaxial layer 12 uniform as shown in FIG. 7. By forming the MOSFET having the structure described above, a high breakdown voltage can be obtained by the n⁻-type epitaxial layer 12 with a small length (small thickness). As a result, a high-resistance MOSFET can be implemented with a low ON resistance.

A modification of the semiconductor device according to the third embodiment will be described next with reference to FIG. 10.

Figure 10:
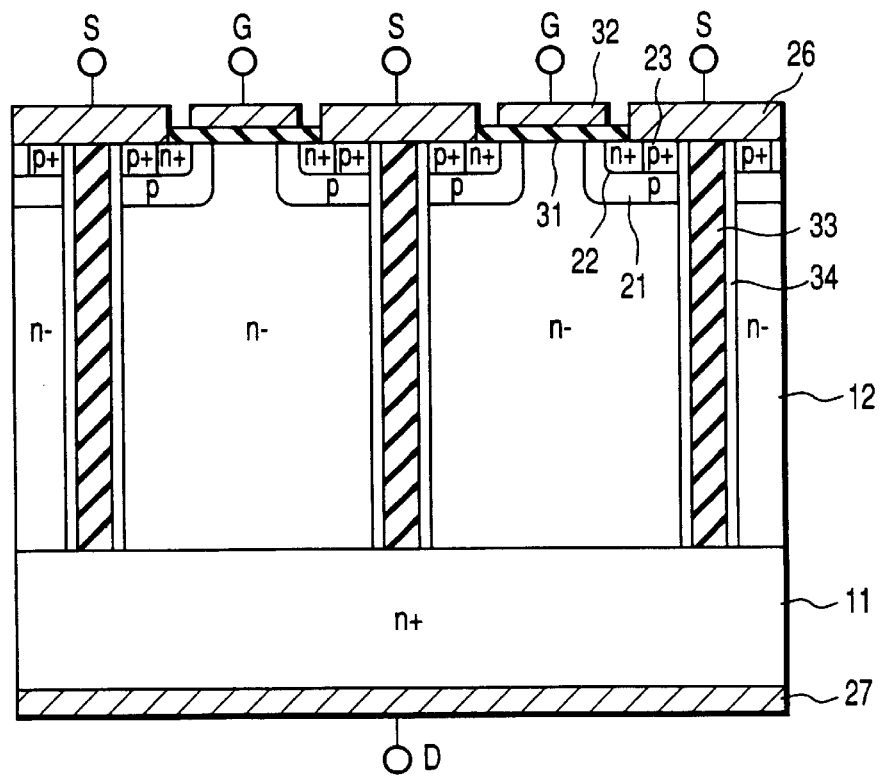
FIG. 10 is a sectional view showing the structure of a high-voltage MOS field effect transistor according to a modification of the third embodiment.

As shown in FIG. 10, a semiconductor device in this modification uses oxide films 33 and SIPOS layers 34 instead of the SIPOS layers 14 in the device shown in FIG. 9. Excepting for this, the structure, function, and effect are the same as those in the third embodiment shown in FIG. 9. The oxide films 33 may be arranged in the trenches in the n⁻-type epitaxial layer 12, and the SIPOS layers 34 are formed on the two sides of each oxide film 33.

As described above, the planar MOS field effect transistor in the third embodiment can obtain a high breakdown voltage without increasing an ON resistance.

Each of the above embodiments includes inventions in various stages. So, these inventions in various stages can be extracted by properly combining a plurality of components disclosed in each embodiment. For example, in the structure shown in FIGS. 4, 8, and 9, even if the SIPOS layers 14 serving as high-resistance elements do not reach the n⁺-type semiconductor substrate 11, the effect in the present invention can be obtained. In addition, since the reverse recovery current of the diode which is formed by the p-type base layer 21 and n⁻-type epitaxial layer 12 built in this structure flows with an appropriate tail current, this diode can use as a free wheel diode. Further, each buried SIPOS layer need not be formed from a high-resistance element. As shown in FIG. 10, only the portions of the layer in contact with the silicon are formed from a high-resistance element, and the inner portion of the layer may be formed from an insulator.

As has been described above, according to the embodiments of the present invention, there can be provided a semiconductor device which can obtain a high breakdown voltage without increasing an ON resistance and stably operate at the start of operation.

Additional advantages and modifications will readily occur to those skilled in the art. Therefore, the invention in its broader aspects is not limited to the specific details and representative embodiments shown and described herein. Accordingly, various modifications may be made without departing from the spirit and scope of the general inventive concept as defined by the appended claims and their equivalents.

What is claimed is:

1. A semiconductor device, comprising:
   a first n-type semiconductor region formed on an n-type semiconductor body, said first n-type semiconductor region having an electric resistance higher than that of the n-type semiconductor body;
   a first p-type semiconductor region formed on said first n-type semiconductor region;
   an anode formed on said first p-type semiconductor region;
   a second n-type semiconductor region formed on the n-type semiconductor body, said second n-type semiconductor region having an electric resistance higher than that of the n-type semiconductor body;
   a second p-type semiconductor region formed on said second n-type semiconductor region, said second p-type semiconductor region being placed in an electrically floating condition due to the absence of said anode on said second p-type semiconductor region;
   a high-resistance region formed in said first and second n-type and first and second p-type semiconductor regions, said high-resistance region being in contact with said first and second n-type and first and second p-type semiconductor regions and extending from an upper surface of said first and second p-type semiconductor regions in a direction of the n-type semiconductor body; and
   a cathode formed on a surface facing the surface of the n-type semiconductor body, on which said first and second semiconductor regions are formed.

2. The semiconductor device according to claim 1, wherein said high-resistance region is in contact with the n-type semiconductor body.

3. The semiconductor device according to claim 1, wherein said high-resistance region has an electric resistance higher than that of said n-type first and second semiconductor regions and lower than that of an insulator.

4. The semiconductor device according to claim 1 wherein a plurality of second p-type semiconductor regions are arranged near a terminal end portion of the semiconductor device in the direction parallel to the electrode surface of the anode.

5. The semiconductor device according to claim 4 wherein a plurality of high-resistance regions are arranged between said plurality of second p-type semiconductor regions which are arranged near the terminal end portion and the anode is not formed on said plurality of high resistance regions.

6. The semiconductor device according to claim 1, wherein said high-resistance region includes a silicon layer doped with oxygen.

7. The semiconductor device according to claim 3, wherein a resistivity of said high-resistance region is $10 \times 10^8$ to $1.0 \times 10^{13}$ Ω·cm.

8. A semiconductor device, comprising:
   a first first-conductivity-type semiconductor region formed on a first-conductivity-type semiconductor body, said first first-conductivity-type semiconductor region having an electric resistance higher than that of the first-conductivity-type semiconductor body;
   a second-conductivity-type semiconductor region formed on said first first-conductivity-type semiconductor region;
   a high-resistance region formed in said first first-conductivity-type and second-conductivity-type semiconductor regions, said high-resistance region being in contact with said first first-conductivity-type and second-conductivity-type semiconductor regions, and extending from an upper surface of said second-conductivity-type semiconductor region in a direction of the first-conductivity-type semiconductor body; a second first-conductivity-type semiconductor region formed on said second-conductivity-type semiconductor region, said second first-conductivity-type semiconductor region having an electric resistance lower than that of said first first-conductivity-type semiconductor region;
   a gate electrode formed in said second-conductivity-type and said second first-conductivity-type semiconductor regions, said gate electrode extending from an upper surface of said second first-conductivity-type semiconductor region to said first first conductivity-type semiconductor region;
   a gate insulating film formed between said gate electrode and said second-conductivity-type and first first-conductivity-type semiconductor regions;
   a source electrode formed on said second first-conductivity-type semiconductor region and said the high resistance region and
   a drain electrode formed on a surface facing to the surface of the first-conductivity-type semiconductor body, on which said first first-conductivity-type semiconductor region is formed,
   wherein a plurality of second semiconductor regions which are placed in an electrically floating condition due to the absence of electrical contact with said source electrode, are arranged near a terminal end portion of the semiconductor device in the direction parallel to the electrode surface of said source electrode.

9. The semiconductor device according to claim 8, wherein said high-resistance region has an electric resistance higher than that of said first first-conductivity-type semiconductor region and lower than that of an insulator.

10. The semiconductor device according to claim 8 wherein a plurality of high-resistance regions are arranged between said plurality of second-conductivity-type semiconductor regions which are arranged near the terminal end portion and said source electrode is not placed on said plurality of high resistance regions.

11. The semiconductor device according to claim 8, wherein said high-resistance region includes a silicon layer doped with oxygen.

12. The semiconductor device according to claim 9, wherein a resistivity of said high-resistance region is $1.0 \times 10^8$ to $1.0 \times 10^{13}$ Ω·cm.

13. A semiconductor device, comprising:
   a first n-type first semiconductor region formed on an n-type semiconductor body, said first n-type semiconductor region having an electric resistance higher than that of the n-type semiconductor body;
   a first p-type semiconductor region formed on said first n-type semiconductor region;
   an anode formed on said first p-type semiconductor region;
   a second n-type semiconductor region formed on the n-type semiconductor body; said second n-type semiconductor region having an electric resistance higher than that of the n-type semiconductor body;
   a second p-type semiconductor region formed on said second n-type semiconductor region the second p-type semiconductor region being placed in electrically floating condition due to the absence of the anode on the second p-type semiconductor region;
   a plurality of high-resistance regions which are formed in a plurality of trenches formed in said first and second n-type and first and second p-type semiconductor regions, said high-resistance regions being in contact with said first and second n-type and first and second p-type semiconductor regions serving as inner walls of the trenches.

14. The semiconductor device according to claim 13, wherein said high-resistance regions are in contact with the n-type semiconductor body.

15. The semiconductor device according to claim 13, wherein said high-resistance regions have an electric resistance higher than that of said n-type semiconductor region and lower than that of an insulator.

16. The semiconductor device according to claims 13, wherein a plurality of second p-type semiconductor regions are arranged near a terminal end portion of the semiconductor device in the direction parallel to the electrode surface of the anode.

17. The semiconductor device according to claim 13, wherein a plurality of high-resistance regions are arranged between said plurality of second p-type semiconductor regions arranged near the terminal end portion and said anode is not placed on said plurality of high resistance regions.

18. The semiconductor device according to claim 13, wherein said high-resistance region includes a silicon layer doped with oxygen.

19. The semiconductor device according to claim 15, wherein a resistivity of said high-resistance region is $1.0 \times 10^8$ to $1.0 \times 10^{13}$ Ω·cm.

20. A semiconductor device comprising:
   a high resistance region formed on an n-type semiconductor body;
   a first n-type semiconductor region formed in said high resistance region on the n-type semiconductor body, said first n-type semiconductor region being in contact with said high resistance region;
   a first p-type semiconductor region formed in said high resistance region on said first n-type semiconductor region, said first p-type semiconductor region being in contact with said high resistance region;
   an anode formed on the first p-type semiconductor region;
   a second n-type semiconductor region formed in said high resistance region on the n-type semiconductor body, said second n-type semiconductor region being in contract with said high resistance region;
   a second p-type semiconductor region formed in said high resistance region on said second n-type semiconductor region, said second p-type semiconductor region being in contact with the said high resistance region and being placed in an electrically floating condition due to the absence of the anode on the second p-type semiconductor region.

21. The semiconductor device according to claim 20, wherein a plurality of second p-type semiconductor regions are arranged near a terminal end portion of the semiconductor device in the direction parallel to the electrode surface of the anode.

22. The semiconductor device according to claim 21, wherein a plurality of high-resistance regions are arranged between said plurality of second p-type semiconductor regions arranged near the terminal end portion and said anode is not placed on said plurality of high resistance regions.

* * * * *